(12) United States Patent
Yamaguchi et al.

(10) Patent No.: US 8,159,307 B2
(45) Date of Patent: Apr. 17, 2012

(54) LOGICAL ELEMENT

(75) Inventors: Hiroshi Yamaguchi, Kanagawa (JP);
Imran Mahboob, Kanagawa (JP);
Hajime Okamoto, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 78 days.

(21) Appl. No.: 12/678,737

(22) PCT Filed: Sep. 19, 2008

(86) PCT No.: PCT/JP2008/066989
§ 371 (c)(1),
(2), (4) Date: Mar. 17, 2010

(87) PCT Pub. No.: WO2009/041362
PCT Pub. Date: Apr. 2, 2009

(65) Prior Publication Data
US 2010/0201420 A1      Aug. 12, 2010

(30) Foreign Application Priority Data

Sep. 27, 2007    (JP) .................................. 2007-251116

(51) Int. Cl.
*H03B 5/30* (2006.01)

(52) U.S. Cl. .................... 331/116 M; 331/154; 331/109; 331/96; 331/107 SL; 331/107 DP

(58) Field of Classification Search .................... 331/18, 331/116 R, 172, 154, 116 M, 107 DP, 107 SL, 331/96
See application file for complete search history.

(56) References Cited

U.S. PATENT DOCUMENTS 3,993,962 A * 11/1976 Hopwood et al. .............. 331/18

FOREIGN PATENT DOCUMENTS

| JP | 42-020422 Y | 11/1967 |
| JP | 2005-123828 A | 5/2005 |
| JP | 2005-197946 A | 7/2005 |
| JP | 2006-238001 A | 9/2006 |
| JP | 2007-235937 A | 9/2007 |

* cited by examiner

*Primary Examiner* — Arnold Kinkead
(74) *Attorney, Agent, or Firm* — Blakely, Sokoloff, Taylor & Zafman

(57) ABSTRACT

In a logical element, supporting portions, and a beam supported by them at two ends are formed. The beam has a back side surface spaced apart from the top side surface of a substrate, creating a space between the facing surfaces of the beam and substrate. An excitation electrode is formed on one supporting portion, whereas an oscillation detecting electrode is formed on the other supporting portion.

14 Claims, 5 Drawing Sheets

APPLICATION SEQUENCE OF EXCITATION AC VOLTAGE
(FREQUENCY $2f_{res}$)

INPUT/OUTPUT SIGNALS AND TEMPORAL CHANGE OF
OSCILLATION PHASE OF EACH BEAM (FREQUENCY $f_{res}$)

LOGICAL ELEMENT

TECHNICAL FIELD

The present invention relates to a logical element which uses a resonator based on mechanical oscillation to store bit information and perform calculation using bit information.

BACKGROUND ART

In information processing apparatuses, storage devices for storing bit information, and arithmetic devices for performing calculation using bit information are widely applied to consumer appliances and communication devices. At present, dominant storage devices and arithmetic devices adopt logical elements such as a transistor made of a semiconductor.

In the 1950s before logical elements using today's semiconductor transistors as basic elements became the mainstream, logical elements called parametrons were extensively studied and developed in Japan. The parametron executes a logical operation by handling, as a bit, an oscillation state having one of two different phases generated when a resonator is parametrically excited (reference 1: E. Goto, "The Parametron, a Digital Computing Element which Utilizes Parametric Oscillation", PROCEEDINGS OF THE IRE, vol. 47, pp. 1309-1316, 1959).

FIG. 10 is a circuit diagram showing the arrangement of the basic elements of a conventional parametron mentioned above. The parametron includes an input AC signal source 1001 having a frequency f, a phase inversion switch 1002, a coupling transformer 1003, a capacitor 1004, a coupling resistor 1005, an inductance 1006 having two coils, an excitation switch 1007, an excitation AC power supply 1008 which generates an excitation AC signal having a frequency 2f, and an output terminal 1009.

The main part of the parametron is formed from the capacitor 1004 and inductance 1006 and is an LC resonator having a resonance frequency f. The LC resonator is parametrically excited at the frequency f by periodically modulating the value of the inductance 1006 of the LC resonator at the frequency 2f in accordance with an excitation AC signal from the excitation AC power supply 1008. Consequently, the LC resonator produces two oscillation states different in phase by $\pi$. Either of the two oscillation states can be selected based on the phase of an input AC signal output from the input AC signal source 1001 before the start of excitation by turning on the excitation switch 1007 and applying an excitation AC signal.

In this parametron, an AC signal with the resonance frequency f output from the input AC signal source 1001 is applied before excitation, causing the LC resonator to resonate via the coupling transformer 1003. In this state, the excitation switch 1007 is turned on to start parametric excitation. Then, the phase of the input AC signal supplied from the input AC signal source 1001 is maintained. This oscillation state continues even if the input of the AC signal from the input AC signal source 1001 is withdrawn later. The phase inversion switch 1002 inverts the AC signal input from the input AC signal source 1001, exciting the LC resonator selectively in the two excitation modes different in phase by $\pi$. The LC resonator can maintain the selected excitation mode.

In calculation using parametrons, the two oscillation states stored in the LC resonator as described above are sequentially transferred to different parametrons. This can implement a shift register, AND circuit, OR circuit, NOT circuit, and the like.

Parametrons were superior in cost and performance to semiconductor elements in those days, and even practical devices were developed. However, subsequent rapid progress of semiconductor transistors forced calling off of the development of parametrons because they were inferior in speed, degree of integration, power consumption, and the like.

DISCLOSURE OF INVENTION

Problems to be Solved by the Invention

However, logical elements using the current mainstream transistors as basic elements require the supply of a predetermined current to continue their operation. As the degree of integration of elements rises, power consumption increases. On the other hand, it is difficult to downsize the conventional parametron because the basic unit of an element is an LC resonator. Since the parametron uses an electrical resonator, crosstalk occurs between elements along with microprocessing and causes a negative effect.

The present invention has been made to solve the above-mentioned drawbacks, and has as its object to suppress an increase in power consumption caused by integration in a logical element which performs storage, calculation, and the like.

Means of Solution to the Problems

A logical element according to the present invention comprises at least an oscillation portion which mechanically oscillates, excitation means for parametrically oscillating the oscillation portion in either of a first oscillation state and second oscillation state different in phase by $\pi$, an input portion which receives a signal for parametric oscillation input into the excitation means, and an output portion which outputs a signal corresponding to either of the first oscillation state and second oscillation state of the oscillation portion that parametrically oscillates. The first oscillation state or second oscillation state at the oscillation portion is maintained after parametric excitation. The logical element of the present invention expresses binary information of "0" or "1" using two signals output from the output portion in correspondence with these two oscillation states.

Effects of the Invention

As described above, according to the present invention, the oscillation portion which mechanically oscillates is parametrically oscillated in either of the first and second oscillation states different in phase by $\pi$, and a signal corresponding to either state is output. The present invention is extremely effective in suppressing an increase in power consumption caused by integration in a logical element which performs storage, calculation, and the like.

BEST MODE FOR CARRYING OUT THE INVENTION

Embodiments of the present invention will be described below with reference to the accompanying drawings.

First Embodiment

Figure 1:
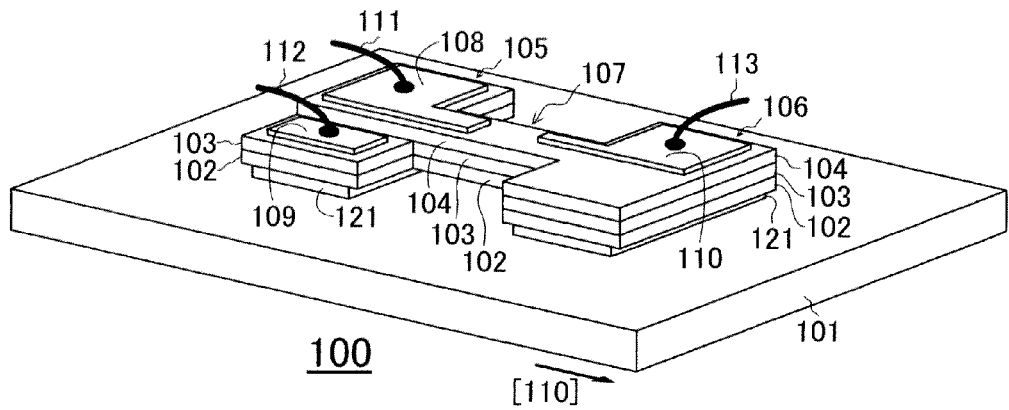
FIG. 1 is a perspective view schematically showing an example of the structure of a logical element 100 in the first embodiment of the present invention.

A logical element in the first embodiment of the present invention will be explained. FIG. 1 is a perspective view schematically showing an example of the structure of a logical element 100 in the first embodiment of the present invention. The logical element 100 has a multilayered structure in which, for example, a sacrificial layer 121 made of single-crystal $Al_{0.7}Ga_{0.3}As$, an insulating layer 102 made of single-crystal insulating GaAs, a conductive layer 103 made of silicon-doped single-crystal conductive GaAs (first semiconductor), and a piezoelectric layer (excitation means) 104 made of single-crystal insulating AlGaAs (second semiconductor) are formed on a GaAs (001) substrate 101. The piezoelectric layer 104 is made of, for example, $Al_{0.3}Ga_{0.7}As$.

Also in the logical element 100, supporting portions 105 and 106 and a beam 107 supported at two ends by them are formed from the multilayered structure. The beam 107 has a back side surface spaced apart from the top side surface of the substrate 101, creating a space between the facing surfaces of the beam 107 and substrate 101. The use of the sacrificial layer 121 enables the formation of this structure, which will be described later.

An excitation electrode (input electrode) 108 is formed on the supporting portion 105, whereas an oscillation detecting electrode (output electrode) 110 is formed on the supporting portion 106. These electrodes are made of a metal material which forms a Schottky barrier junction with respect to the semiconductor piezoelectric layer 104. The electrode has, for example, a multilayered structure of a Ti layer and an Au layer formed on it. A common electrode 109 is formed on a portion of the conductive layer 103 that is exposed by removing the piezoelectric layer 104 from part of the supporting portion 105. The common electrode 109 is made of a metal material which ohmic-contacts the conductive layer 10. An example of such a material is an AuGeNi alloy.

A line 111 is connected to the excitation electrode 108 to supply an AC signal for parametric excitation and the like. A ground line 112 is connected to the common electrode 109. An oscillation detecting line 113 is connected to the oscillation detecting electrode 110 to output a signal generated by oscillation of the beam 107. In this logical element, the conductive layer 103 functions as a common electrode which faces the excitation electrode 108 and detecting electrode 110 via the piezoelectric layer 104.

The manufacture of the logical element 100 will be described briefly. For example, a sacrificial layer 121 is epitaxially grown on a substrate 101, and then insulating GaAs is epitaxially grown on the sacrificial layer 121. Silicon-doped single-crystal conductive GaAs is epitaxially grown on the insulating GaAs layer, and insulating $Al_{0.3}Ga_{0.7}As$ is epitaxially grown on the conductive GaAs layer. It suffices to form these layers by heteroepitaxial growth.

After that, the stacked films are microprocessed into the planar shapes of a supporting portion 105, beam 107, and supporting portion 106 by a known lithography technique and etching technique. In this state, the sacrificial layer 121 is selectively removed from the remaining layers, creating a space between the facing surfaces of the beam 107 and substrate 101 in the region of the beam 107. This example employs a sacrificial layer 121 containing Al more heavily than the remaining layers. The sacrificial layer 121 can therefore be selectively etched away.

Also at the supporting portions except for the beam 107, the sacrificial layer 121 is etched away from the side. However, the portion designed to be the beam 107 is formed narrower than the remaining regions to be the supporting portions. Thus, even if the sacrificial layer 121 is removed from the region of the beam 107, the sacrificial layer 121 can be left in the remaining regions. For example, when the sacrificial layer 121 is removed from the region of the beam 107, etching is stopped, leaving the sacrificial layer 121 in the regions of the supporting portions 105 and 106. As a result of this process, the sacrificial layer 121 is set back from the remaining layers in the regions of the supporting portions 105 and 106. Note that the manufacturing method is not limited to the above-described one, and a beam may be formed by another method.

In a region where a common electrode 109 is to be formed, the insulating AlGaAs layer (piezoelectric layer 104) which forms the supporting portion 105 is partially removed, exposing the conductive GaAs layer (conductive layer 103) at this portion. Thereafter, an excitation electrode 108, common electrode 109, and oscillation detecting electrode 110 are formed using a well-known liftoff method or the like.

In the logical element 100 having the foregoing structure in the embodiment, the elastic beam 107 has a resonance frequency $f_{res}$. The ground line 112 is grounded, and a voltage is applied to the excitation electrode 108 via the parametric excitation line 111. Owing to the piezoelectric effect of the piezoelectric layer 104, the beam 107 distorts in a direction in which it extends, in proportion to the applied voltage. The distortion changes the resonance frequency of the beam 107. By applying an AC voltage having a frequency $2f_{res}$ to the excitation electrode 108, the beam 107 distorts periodically at the frequency $2f_{res}$. Hence, the resonance frequency of the beam 107 is modulated at the frequency $2f_{res}$, and the beam 107 is parametrically excited at the frequency $f_{res}$.

In the embodiment, the beam 107 is formed from, for example, a conductive GaAs layer and insulating AlGaAs layer. Since a layer large in band gap and high in breakdown voltage, like AlGaAs, exists in the multilayered structure, a larger voltage can be applied to the beam 107. The piezoelectric layer 104, which has the piezoelectric effect and serves as an oscillation generating source, is made of a compound semiconductor larger in band gap than the remaining layers such as the conductive layer 103. The breakdown voltage of the piezoelectric layer 104 can therefore be improved, allowing the application of a larger voltage. According to the embodiment, the beam 107 can produce a larger distortion. Because of high breakdown voltage, further size reduction can be promoted while suppressing a leakage current. In addition, the beam 107 is formed from a single crystal and exhibits an excellent mechanical characteristic.

Figure 2:
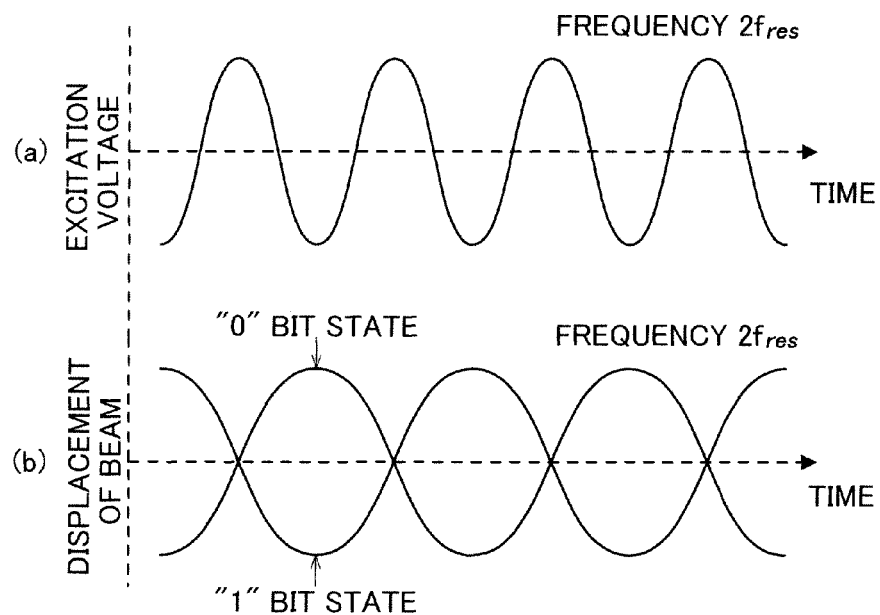
FIG. 2 is a graph for explaining two different excitation states.

The beam 107 excited as described above can take two excitation states different in oscillation phase by π as shown in (b) of FIG. 2 with respect to an excitation voltage shown in (a) of FIG. 2. Digital calculation can be done using these two states by making the two excitation states as "0" and "1" bit states. The excitation state of the beam 107 can be detected via the ground line 112 and oscillation detecting line 113 as a piezoelectric voltage generated between the oscillation detecting electrode 110 and the common electrode 109.

Figure 3:
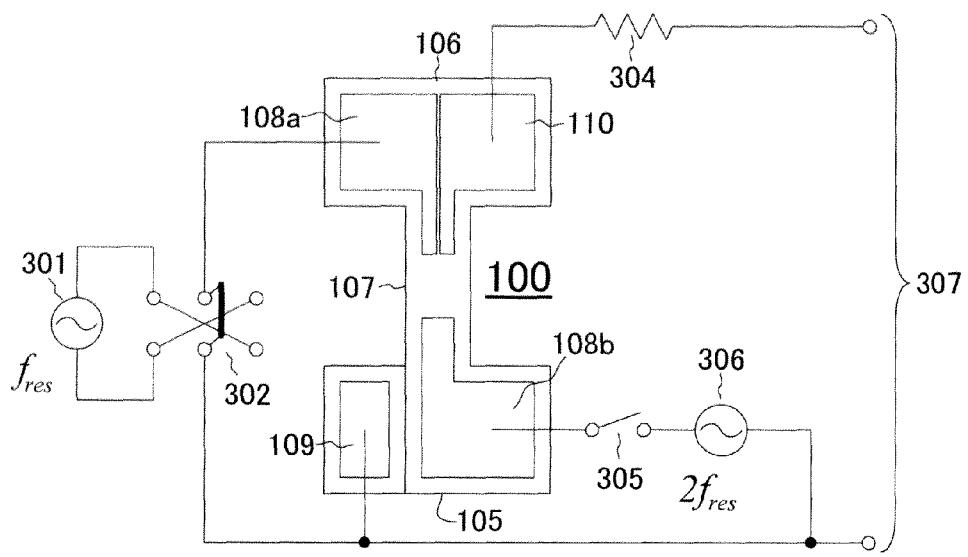
FIG. 3 is a circuit diagram showing the arrangement of a circuit for driving the logical element 100.

A circuit for driving the logical element 100 having the above-described structure will be explained. FIG. 3 is a circuit diagram showing the arrangement of the circuit for driving the logical element 100. As described above, the logical element 100 connected to this circuit includes the beam 107 which is supported by the supporting portions 105 and 106 at two ends and has the resonance frequency $f_{res}$.

The input electrode is made up of an initial excitation electrode (first electrode) 108a for initially exciting the beam 107 and a parametric excitation electrode (second electrode) 108b for parametrically exciting the beam 107. Two AC voltages which have the resonance frequency of the beam 107 and differ in phase by π are selectively applied to the initial excitation electrode 108a. An AC voltage having a frequency double the resonance frequency of the beam 107 is applied to the parametric excitation electrode 108b in order to parametrically excite the beam 107.

The initial excitation electrode 108a is arranged at the supporting portion 106, and the parametric excitation electrode 108b is arranged at the supporting portion 105. Note that the initial excitation electrode 108a and parametric excitation electrode 108b are Schottky electrodes.

This circuit also includes an input AC signal source 301 which generates an input AC signal having the frequency $f_{res}$, a phase inversion switch 302, a coupling resistor 304, an excitation switch 305, an excitation AC signal source 306 which generates an excitation AC signal having the frequency $2f_{res}$, and an output terminal 307.

In this circuit, the excitation switch 305 is turned on to apply an excitation AC signal having the frequency $2f_{res}$ from the excitation AC signal source 306 to the parametric excitation electrode 108b. Then, the beam 107 distorts periodically in a direction in which it extends, and is parametrically excited at the frequency $f_{res}$. As described above, either of the two oscillation states different in phase by π can be selected based on the phase of an AC signal input from the input AC signal source 301 before the start of parametric excitation by turning on the excitation switch 305.

For example, while the excitation switch 305 is OFF, the phase inversion switch 302 is turned on in either state to apply an input AC signal having the frequency $f_{res}$ from the input AC signal source 301 to the initial excitation electrode 108a, causing the beam 107 to resonate in either state (either of the first and second oscillation states different in phase by π). Thereafter, the excitation switch 305 is turned on to apply an excitation AC signal having the frequency $2f_{res}$ to the parametric excitation electrode 108b, starting parametric excitation. In the parametric oscillation state, the phase of oscillation of the beam 107 based on the input AC signal is maintained. Even if the excitation switch 305 is turned on and then the phase inversion switch 302 is turned off to stop the supply of the input AC signal, the phase of oscillation of the beam 107 is maintained. From this, one of the two oscillation modes opposite (shifted) in phase by π can be selected and maintained by turning on the phase inversion switch 302 in either state and causing parametric excitation. In this way, the logical element according to the embodiment can perform an operation equivalent to that of a conventional parametron using an LC resonator. The circuit shown in FIG. 3 is usable as a memory cell for digital information.

Note that the initial excitation electrode 108a, parametric excitation electrode 108b, common electrode 109, and oscillation detecting electrode 110 need not always be made of metal materials, and may be formed from conductive semiconductor thin films. These electrodes can be made of, for example, silicon-doped GaAs. The semiconductor materials are GaAs and AlGaAs, but are not limited to them and may be other compound semiconductors such as InAs, InP, InSb, InN, GaP, GaSb, GaN, AlP, AlSb, and AlN without departing from the gist of the present invention. An impurity such as silicon is doped to render a layer conductive. In this case, the electrical characteristic may be improved using a well-known modulation-doped structure.

[Arithmetic Circuit 1]

Figure 4:
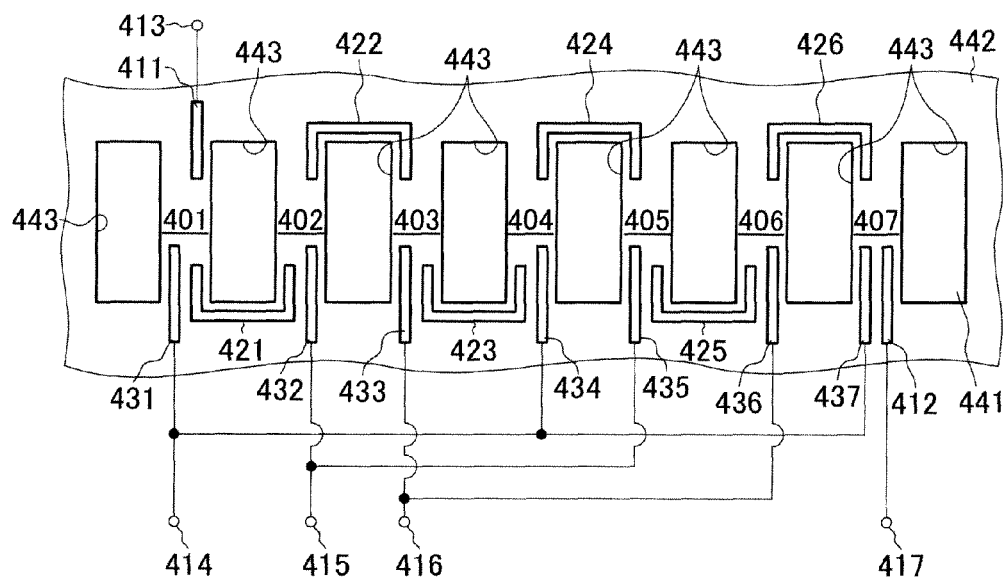
FIG. 4 is a plan view showing the arrangement of a shift register using the logical element in the first embodiment.

An arithmetic circuit (shift register) using the logical element in the first embodiment of the present invention will be described. FIG. 4 is a plan view showing the arrangement of the shift register using the logical element in the present invention. In this example, the shift register includes seven logical elements. For example, an insulating layer (not shown) made of single-crystal insulating GaAs, a conductive layer (not shown) made of silicon-doped single-crystal conductive GaAs (first semiconductor), and a piezoelectric layer 442 made of single-crystal insulating AlGaAs (second semiconductor) are stacked on a GaAs (001) substrate 441. A plurality of openings 443 are formed at predetermined intervals, and beams 401 to 407 are formed between them. Multilayered portions extending to the beams 401 to 407 at two ends in the region of the piezoelectric layer 442 serve as supporting portions which support the beams 401 to 407. The openings 443 are formed in line in a predetermined direction (lateral direction in FIG. 4). The beams 401 to 407 are also arrayed in line.

In FIG. 4, the insulating layer of insulating GaAs and the conductive layer of conductive GaAs are not illustrated because they are arranged below the piezoelectric layer 442. A space is created between the facing surfaces of the substrate 441 and the beams 401 to 407, but is not illustrated, either. A common electrode described with reference to FIGS. 1 and 3 is connected to the conductive layer of conductive GaAs in another region (not shown), and commonly used for a plurality of logical elements.

In the seven logical elements having the beams 401 to 407, respectively, as described above, a signal input electrode 411 for inputting a signal is arranged on one side (upper side in FIG. 4) of the beam 401, and an excitation electrode 431 for parametric excitation is arranged on the other side. A transfer electrode (oscillation coupling means) 421 for transferring an oscillation state is arranged from the other side of the beam 401 to that of the beam 402. An excitation electrode 432 for parametric excitation is arranged on the other side of the beam 402. A transfer electrode 422 for transferring an oscillation state is arranged from one side of the beam 402 to that of the beam 403. An excitation electrode 433 for parametric excitation is arranged on the other side of the beam 403.

Similarly, a transfer electrode 423 for transferring an oscillation state is arranged from the other side of the beam 403 to that of the beam 404. An excitation electrode 434 for parametric excitation is arranged on the other side of the beam 404. A transfer electrode 424 for transferring an oscillation state is arranged from one side of the beam 404 to that of the beam 405. An excitation electrode 435 for parametric excitation is arranged on the other side of the beam 405.

Also, a transfer electrode 425 for transferring an oscillation state is arranged from the other side of the beam 405 to that of the beam 406. An excitation electrode 436 for parametric excitation is arranged on the other side of the beam 406. A transfer electrode 426 for transferring an oscillation state is arranged from one side of the beam 406 to that of the beam 407. An excitation electrode 437 for parametric excitation and a signal output electrode 412 for outputting a signal are arranged on the other side of the beam 407.

On the other side of the beams 401 to 406, the excitation electrodes and transfer electrodes are arranged on the left and right sides of a center line in the direction in which each beam extends, while being insulated from each other. On the other side of the beam 407, the excitation electrode 437 and signal output electrode 412 are arranged on the left and right sides of a center line in the direction in which the beam extends, while being insulated from each other. An input terminal 413 is connected to the signal input electrode 411. An excitation voltage applying terminal 414 is commonly connected to the excitation electrodes 431, 434, and 437. An excitation voltage applying terminal 415 is commonly connected to the excitation electrodes 432 and 435. An excitation voltage applying terminal 416 is commonly connected to the excitation electrodes 433 and 436. A signal output terminal 417 is connected to the signal output electrode 412.

Figure 5:
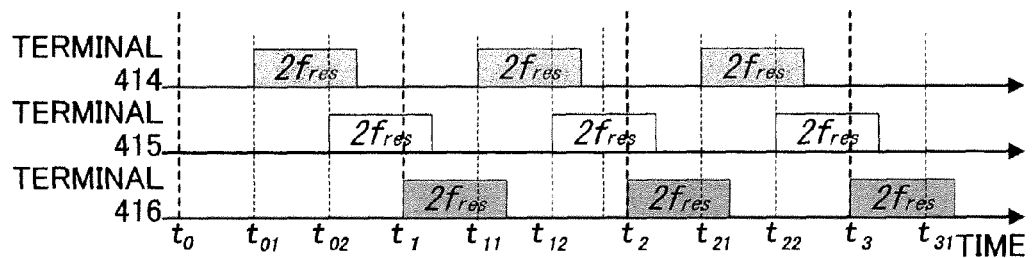
FIG. 5 is a timing chart for explaining an example of the operation of the shift register.
Figure 6:
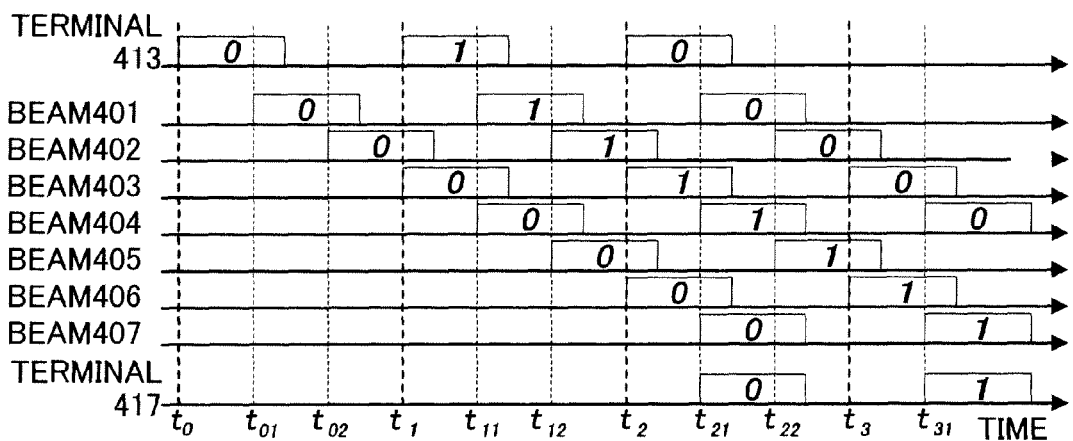
FIG. 6 is a timing chart for explaining an example of the operation of the shift register.

The operation of this shift register will be exemplified with reference to the timing charts of FIGS. 5 and 6. Note that an AC signal having the frequency $f_{res}$ corresponds to a voltage input to the input terminal 413, and two different phases correspond to states "0" and "1". First, at time $t_0$, an AC voltage (input signal) having a phase corresponding to the "0" state is applied to the electrode 411 via the input terminal 413. Then, the beam 401 starts oscillating with the phase of the applied AC voltage.

At time $t_{01}$, an excitation voltage having the frequency $2f_{res}$ is applied to the excitation electrode 431 via the excitation voltage applying terminal 414. In response to this, the beam 401 is parametrically excited while maintaining the phase corresponding to the "0" state. As is well known, the excitation electrode 431 receives an excitation voltage having the frequency $2f_{res}$ which causes excitation at a predetermined amplitude or larger at which parametric excitation occurs. After being parametrically excited, the beam 401 keeps oscillating in the same way even if the input of the signal having the frequency $f_{res}$ to the input terminal 413 stops.

As a consequence, an AC voltage having the phase corresponding to the "0" state equivalent to the excitation (oscillation) state is generated in the transfer electrode 421 because of the piezoelectric effect in the parametrically excited beam 401. The AC voltage which is generated in the transfer electrode 421 and has the phase corresponding to the "0" state is applied to the adjacent beam 402 to initially oscillate it. At time $t_{02}$, an excitation voltage having the frequency $2f_{res}$ is applied to the excitation electrode 432 via the excitation voltage applying terminal 415. Then, the beam 402 is parametrically excited while maintaining the phase corresponding to the "0" state. Even after the application (input) of the excitation voltage having the frequency $2f_{res}$ to the excitation electrode 431 (excitation voltage applying terminal 414) is withdrawn, the beam 402 keeps oscillating in the same way. At this stage, "0" information (input signal) input to the input terminal 413 has been transferred from the beam 401 to the beam 402.

In the same fashion, at time $t_1$, an excitation voltage having the frequency $2f_{res}$ is applied to the excitation electrode 433 via the excitation voltage applying terminal 416, transferring the oscillation of the beam 402 to the beam 403. At time $t_{11}$, an excitation voltage having the frequency $2f_{res}$ is applied to the excitation electrode 434 via the excitation voltage applying terminal 414, transferring the oscillation of the beam 403 to the beam 404. At time $t_{12}$, an excitation voltage having the frequency $2f_{res}$ is applied to the excitation electrode 435 via the excitation voltage applying terminal 415, transferring the oscillation of the beam 404 to the beam 405. At time $t_2$, an excitation voltage having the frequency $2f_{res}$ is applied to the excitation electrode 436 via the excitation voltage applying terminal 416, transferring the oscillation of the beam 405 to the beam 406. At time $t_{21}$, an excitation voltage having the frequency $2f_{res}$ is applied to the excitation electrode 437 via the excitation voltage applying terminal 414, transferring the oscillation of the beam 406 to the beam 407. Finally, an AC voltage having the phase corresponding to the "0" state equivalent to the oscillation state is generated in the signal output electrode 412 because of the piezoelectric effect in the beam 407 to which the oscillation has been transferred. The signal output terminal 417 outputs this AC voltage.

In the same manner, input signals corresponding to "0" or "1" are sequentially input to the input terminal 413. Excitation voltages having the frequency $2f_{res}$ are sequentially applied to the excitation voltage applying terminals 414, 415, and 416 according to the sequence shown in FIG. 5. In response to this, "0" or "1" information input to the input terminal 413 is sequentially transferred from the beam 401 to the beam 407 and output from the signal output terminal 417, as shown in FIG. 6.

To stably perform the above-described shift register operation, the beams 401 to 407 need to have the same resonance frequency. The beams 401 to 407 having the piezoelectric layer 442 with piezoelectricity can change the resonance frequency by applying a DC voltage. For example, capacitors are inserted in lines between the excitation electrodes 431, 432, 433, 434, 435, 436, and 437 and the excitation voltage applying terminals 414, 415, and 416 so that a DC bias voltage is applicable between the excitation electrodes and the capacitors. By adjusting the applied bias voltage for each beam, the beams 401 to 407 can have the same resonance frequency.

[Arithmetic Circuit 2]

Figure 7:
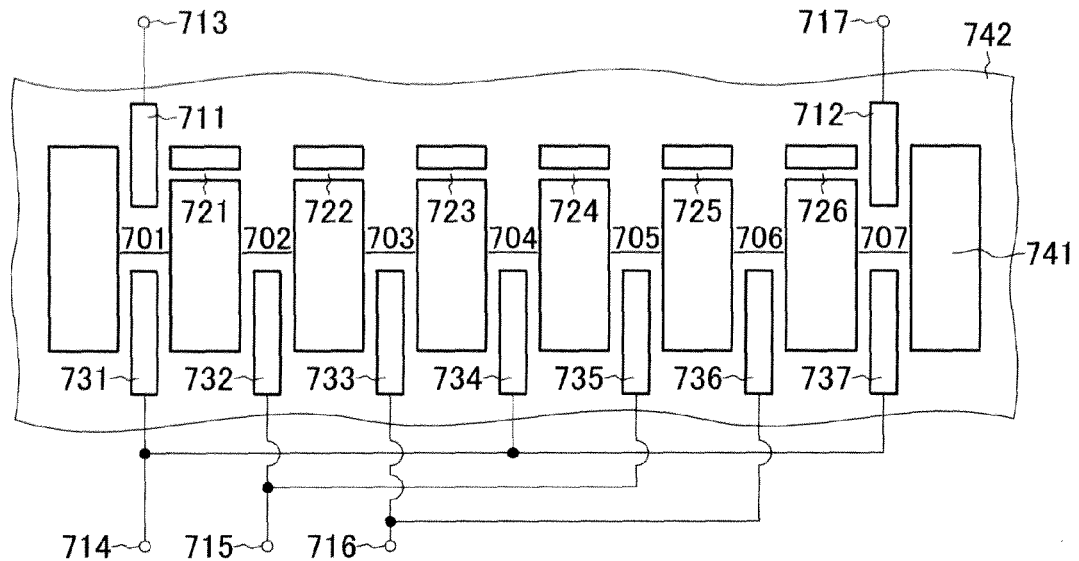
FIG. 7 is a plan view showing the arrangement of a shift register in another form using the logical element in the first embodiment.

A shift register in another form using the logical element in the embodiment of the present invention will be explained with reference to the plan view of FIG. 7. In the following shift register, the oscillations of adjacent beams are mechanically coupled. In this example, the shift register includes seven logical elements. For example, an insulating layer (not shown) made of single-crystal insulating GaAs, a conductive layer (not shown) made of silicon-doped single-crystal conductive GaAs, and a piezoelectric layer 742 made of single-crystal insulating AlGaAs are stacked on a GaAs (001) substrate 741. A plurality of openings are formed at predetermined intervals, and beams 701 to 707 are formed between them. This structure is the same as that of the shift register explained with reference to FIG. 4.

In the seven logical elements having the beams 701 to 707, respectively, as described above, a signal input electrode 711 for inputting a signal is arranged on one side (upper side in FIG. 7) of the beam 701, and an excitation electrode 731 for parametric excitation is arranged on the other side. A coupling beam (oscillation coupling means) 721 for transferring an oscillation state is formed to partially connect the beam 701 on one side and the beam 702 on one side. An excitation electrode 732 for parametric excitation is arranged on the other side of the beam 702. A coupling beam 722 for transferring an oscillation state is formed to partially connect the beam 702 on one side and the beam 703 on one side. An excitation electrode 733 for parametric excitation is arranged on the other side of the beam 703.

Similarly, a coupling beam 723 for transferring an oscillation state is formed to partially connect the beam 703 on one side and the beam 704 on one side. An excitation electrode 734 for parametric excitation arranged on the other side of the beam 704. A coupling beam 724 for transferring an oscillation state is formed to partially connect the beam 704 on one side and the beam 705 on one side. An excitation electrode 735 for parametric excitation is arranged on the other side of the beam 705.

Also, a coupling beam 725 for transferring an oscillation state is formed to partially connect the beam 705 on one side and the beam 706 on one side. An excitation electrode 736 for parametric excitation is arranged on the other side of the beam 706. A coupling beam 726 for transferring an oscillation state is formed to partially connect the beam 706 on one side and the beam 707 on one side. An excitation electrode 737 for parametric excitation is arranged on the other side of the beam 707, and a signal output electrode 712 for outputting a signal is arranged on one side.

Similar to the shift register described with reference to FIG. 4, an input terminal 713 is connected to the signal input electrode 711. An excitation voltage applying terminal 714 is commonly connected to the excitation electrodes 731, 734, and 737. An excitation voltage applying terminal 715 is commonly connected to the excitation electrodes 732 and 735. An excitation voltage applying terminal 716 is commonly connected to the excitation electrodes 733 and 736. A signal output terminal 717 is connected to the signal output electrode 712.

The operation of this shift register will be exemplified. First, an AC voltage (input signal) having a phase corresponding to, for example, the "0" state is applied to the electrode 711 via the input terminal 713. Then, the beam 701 starts oscillating with the phase of the applied AC voltage. Next, an excitation voltage having the frequency $2f_{res}$ is applied to the excitation electrode 731 via the excitation voltage applying terminal 714. In response to this, the beam 701 is parametrically excited at a larger amplitude while maintaining the phase corresponding to the "0" state. In this state, the beam 701 keeps oscillating in the same way even if the input of the signal having the frequency $f_{res}$ to the input terminal 713 stops.

The oscillation of the parametrically excited beam 701 is transferred to the beam 702 via the coupling beam 721 to initially oscillate the beam 702. In this state, an excitation voltage having the frequency $2f_{res}$ is applied to the excitation electrode 732 via the excitation voltage applying terminal 715. Then, the beam 702 is parametrically excited while maintaining the phase corresponding to the "0" state. Even after the application (input) of the excitation voltage having the frequency $2f_{res}$ to the excitation electrode 731 (excitation voltage applying terminal 714) stops, the beam 702 keeps oscillating in the same fashion. At this stage, "0" information (input signal) input to the input terminal 713 has been transferred from the beam 701 to the beam 702.

In this shift register, adjacent beams are connected by the coupling beams 721 to 726. This shift register does not require two electrodes arrayed in the widthwise direction of a single beam even if further size reduction progresses. This shift register can promote size reduction much more than the shift register described with reference to FIG. 4. For example, the coupling beam can be formed from a carbon nanotube, nanowire, or the like. Coupling adjacent beams by a very thin structure can implement an excellent arithmetic device (shift register) which suppresses a change of the resonance frequency caused by coupling.

[Arithmetic Circuit 3]

A logical circuit (arithmetic circuit) using the logical element in the embodiment of the present invention will be explained. In the following example, the logical element is applied to an AND/OR circuit.

Figure 8:
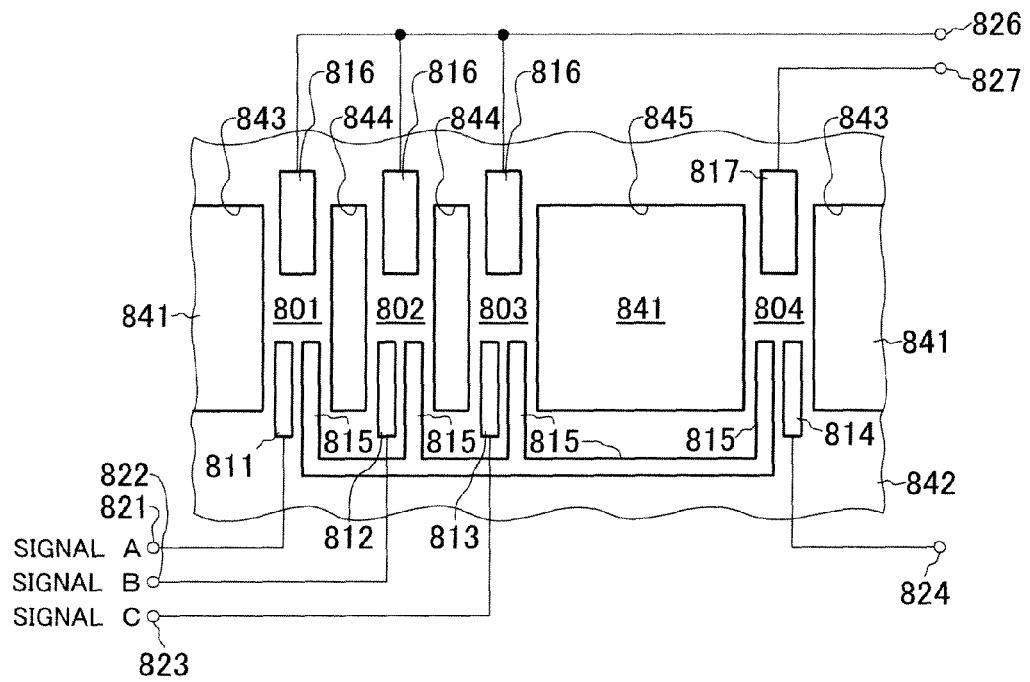
FIG. 8 is a plan view showing the arrangement of a logical circuit using the logical element in the first embodiment.

FIG. 8 is a plan view showing the arrangement of the logical circuit using the logical element in the present invention. The logical circuit includes four logical elements. For example, an insulating layer (not shown) made of single-crystal insulating GaAs, a conductive layer (not shown) made of silicon-doped single-crystal conductive GaAs (first semiconductor), and a piezoelectric layer 842 made of single-crystal insulating AlGaAs (second semiconductor) are stacked on a GaAs (001) substrate 841.

In the multilayered structure of these layers, openings 843, openings 844, and openings 845 are formed at predetermined intervals, and beams 801, 802, 803, and 804 are formed between them. Multilayered portions extending to the beams 801 to 804 at two ends in the region of the piezoelectric layer 842 serve as supporting portions which support the beams 801 to 804. The openings 843, 844, and 845 are formed in line in a predetermined direction (lateral direction in FIG. 8). The beams 801 to 804 are also arrayed in line.

In FIG. 8, the insulating layer of insulating GaAs and the conductive layer of conductive GaAs are not illustrated because they are arranged below the piezoelectric layer 842. A space is created between the facing surfaces of the substrate 841 and the beams 801 to 804, but is not illustrated, either. A common electrode described with reference to FIGS. 1 and 3 is connected to the conductive layer of conductive GaAs in another region (not shown), and commonly used for a plurality of logical elements.

In the four logical elements having the beams 801 to 804, respectively, as described above, a signal A input electrode 811 for inputting a signal A is arranged on one side (lower side in FIG. 8) of the beam 801. A signal B input electrode 812 for inputting a signal B is arranged on one side of the beam 802. A signal C input electrode 813 for inputting a signal C is arranged on one side of the beam 803. In contrast, an output electrode 814 is arranged on one side of the beam 804.

Transfer electrodes (oscillation coupling means) 815 are commonly arranged on one side of the beams 801, 802, 803, and 804 to transfer the oscillation states of the beams 801, 802, and 803 to the beam 804. The transfer electrode 815 formed on one side of each beam is insulated from the input electrode of the beam and the output electrode 814. The transfer electrode and input electrode are arranged divisionally on the left and right sides of a center line in the direction in which each beam extends.

Input excitation electrodes 816 for parametric excitation are commonly arranged on the other side (upper side in FIG. 8) of the beams 801, 802, and 803. An output excitation electrode 817 for parametrically exciting the beam 804 is arranged on the other side of the beam 804.

A signal A input terminal 821 is connected to the signal A input electrode 811, a signal B input terminal 822 is connected to the signal B input electrode 812, a signal C input terminal 823 is connected to the signal C input electrode 813, and an output terminal 824 is connected to the output electrode 814. An excitation voltage applying terminal 826 is commonly connected to the input excitation electrodes 816 respectively arranged for the beams 801, 802, and 803. An excitation voltage applying terminal 827 is connected to the output excitation electrode 817 arranged for the beam 804.

The operation of this logical circuit will be exemplified. First, AC voltages (signals A, B, and C) of the frequency $f_{res}$ having a phase (bit information) corresponding to the "0" or "1" state are input to the signal A input terminal 821, signal B input terminal 822, and signal C input terminal 823. The input signals A, B, and C are applied to the beams 801, 802, and 803 via the signal A input electrode 811, signal B input electrode 812, and signal C input electrode 813. As a result, the beams 801, 802, and 803 start initial oscillation with the phases of the applied AC voltages (signals A, B, and C).

Next, an excitation voltage having the res is applied to the excitation voltage applying terminal 826. The input excitation voltage is applied to the beams 801, 802, and 803 via the input excitation electrode 816. The excitation voltage having the frequency $2f_{res}$ is applied to the beams 801, 802, and 803 which have already started initial oscillation as described above. The beams 801, 802, and 803 are parametrically excited while maintaining phases corresponding to the initial oscillations. After being parametrically excited, the beams 801, 802, and 803 keep parametrically oscillating while maintaining the phases corresponding to the initial oscillations, even if the input of the AC voltages (signals A, B, and C) having the frequency $f_{res}$ for causing initial excitation is withdrawn.

The transfer electrodes 815 transfer the parametric oscillations of the excited beams 801, 802, and 803 as piezoelectric signals to the beam 804. In response to this, the beam 804 starts initial oscillation. In this manner, the transfer electrodes 815 transfer the parametric oscillations of the beams 801, 802, and 803 as the initial oscillation of the beam 804. At this time, transfer outputs from the three, beams 801, 802, and 803 are added. As a result, an AC voltage of the frequency $f_{res}$ corresponding to a phase which occurs more frequently among the beams 801, 802, and 803 is applied to the beam 804.

In this state, an excitation voltage having the frequency $2f_{res}$ is input to the excitation voltage applying terminal 827, and applied to the beam 804 via the output excitation electrode 817. Then, the beam 804 starts parametrically oscillating with a phase which occurs more frequently among the beams 801, 802, and 803. A piezoelectric signal corresponding to the parametric oscillation is generated in the output electrode 814 and output from the output terminal 824.

As described above, the respective phases of the beams 801, 802, and 803 are regarded as pieces of bit information. The logical circuit is configured to transfer, to the beam 804, bit information which occurs more frequently among the beams 801, 802, and 803. Hence, the output terminal 824 outputs bit information corresponding to a phase that occurs more frequently in signals input to the signal A input terminal 821, signal B input terminal 822, and signal C input terminal 823.

Table 1 below shows the correspondence between pieces of bit information of the signals A, B, and C input to the signal A input terminal 821, signal B input terminal 822, and signal C input terminal 823, and bit information output from the output terminal 824.

TABLE 1

|  | B or C | | | | B and C | | | |
|---|---|---|---|---|---|---|---|---|
| Input signal A | 1 | 1 | 1 | 1 | 0 | 0 | 0 | 0 |
| signal B | 0 | 1 | 0 | 1 | 0 | 1 | 0 | 1 |
| signal C | 0 | 0 | 1 | 1 | 0 | 0 | 1 | 1 |
| Output | 0 | 1 | 1 | 1 | 0 | 0 | 0 | 1 |

As is apparent from Table 1, when an AC signal corresponding to bit information "1" is input to the signal A input terminal 821 and an AC signal corresponding to bit information "1" is input to either the signal B input terminal 822 or signal C input terminal 823, the output terminal 824 outputs an AC signal corresponding to bit information "1". As described above, bit information which occurs more frequently in the signals A, B, and C is output. Thus, when the signal A is "1" and either the signal B or C is "1", bit information which occurs more frequently in the signals A, B, and C is "1", which is output. This is the operation of the OR circuit.

When an AC signal corresponding to bit information "0" is input to the signal A input terminal 821 and AC signals corresponding to bit information "1" are input to both the signal B input terminal 822 and signal C input terminal 823, the output terminal 824 outputs an AC signal corresponding to bit information "1". As described above, bit information which occurs more frequently in the signals A, B, and C is output. When the signal A is "0" and both the signals B and C are "1", bit information which occurs more frequently in the signals A, B, and C is "1", which is output. This is the operation of the AND circuit. In this fashion, the logical circuit in the embodiment can configure OR and AND circuits.

In the above description, a beam is formed from a piezoelectric material, and an electrode arranged for the beam induces initial excitation and parametric excitation and detects oscillation, but the present invention is not limited to this. The logical element according to the present invention is characterized by comprising at least an oscillation portion which has flexibility or the like and mechanically oscillates, an excitation means for parametrically oscillating the oscillation portion in either of the first and second oscillation states different in phase by $\pi$, an input portion which receives a signal for parametric oscillation input into the excitation means, and an output portion which outputs a signal corresponding to either the first or second oscillation state of the oscillation portion that parametrically oscillates.

The logical element can maintain the first or second oscillation state by parametric oscillation when the excitation means parametrically excites the oscillation portion which has oscillated in either of the first and second oscillation states different in phase by $\pi$. This state is output from the output portion and thus is detectable. The logical element can handle the two oscillation states different in phase as a bit "0" or "1" (binary information), similar to a conventional parametron. The logical element of the present invention can perform storage and a logical operation, similar to the parametron.

In the above-described embodiment, the oscillation portion is formed from a beam having, as the excitation means, a piezoelectric layer made of a piezoelectric material. By an AC voltage input to an input electrode arranged for the beam, the oscillation portion is excited in either of the first and second oscillation states different in phase by $\pi$, thereby causing parametric oscillation. An output electrode arranged for the beam detects the oscillation.

The oscillation portion may be a beam supported at two ends, as described above, or a cantilever supported at one end or a torsion beam. The oscillation portion may be a thin film (diaphragm) fixed at the periphery. The oscillation portion suffices to be able to be parametrically excited.

The oscillation portion and excitation means are not limited to the beam having the piezoelectric layer, and the beam may be oscillated by capacitive coupling. For example, a fixed electrode is arranged at a predetermined distance from the oscillation portion serving as a movable electrode. A signal is applied between the oscillation portion and the fixed electrode to excite and parametrically excite the oscillation portion by electrostatic force (Coulomb force). The oscillation of the oscillation portion changes the interval (distance) between the oscillation portion and the fixed electrode. This change can be detected as a change of the capacitance.

Second Embodiment

Figure 9:
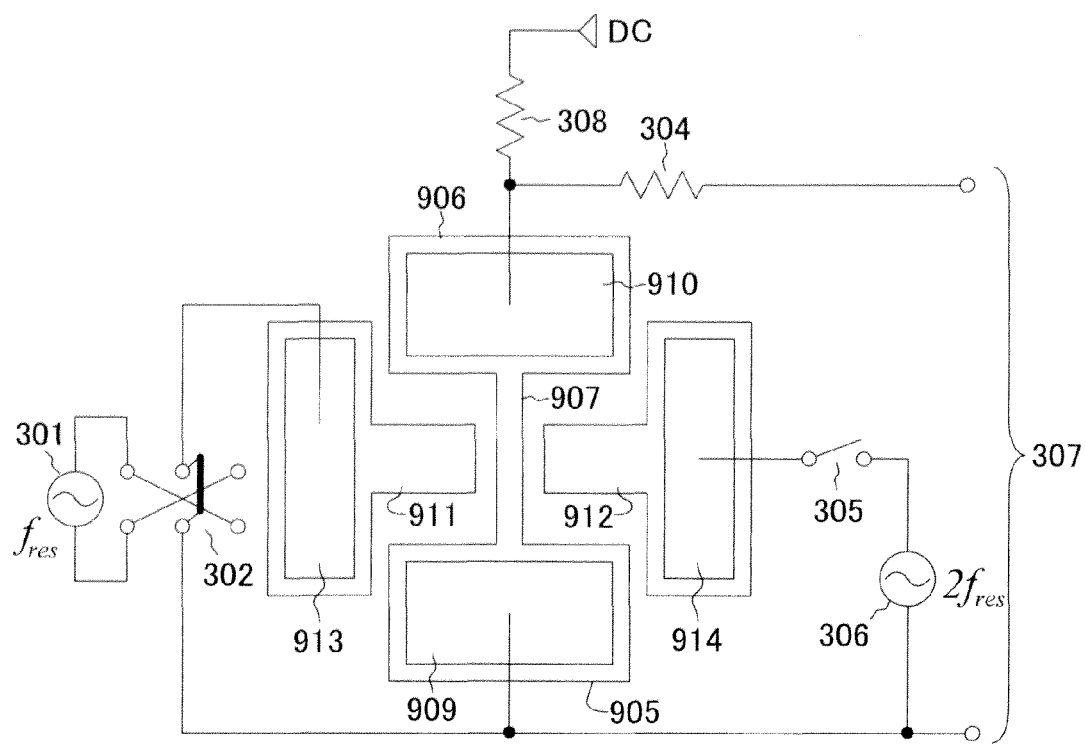
FIG. 9 is a plan view schematically showing the arrangement of a logical element in the second embodiment of the present invention.
Figure 10:
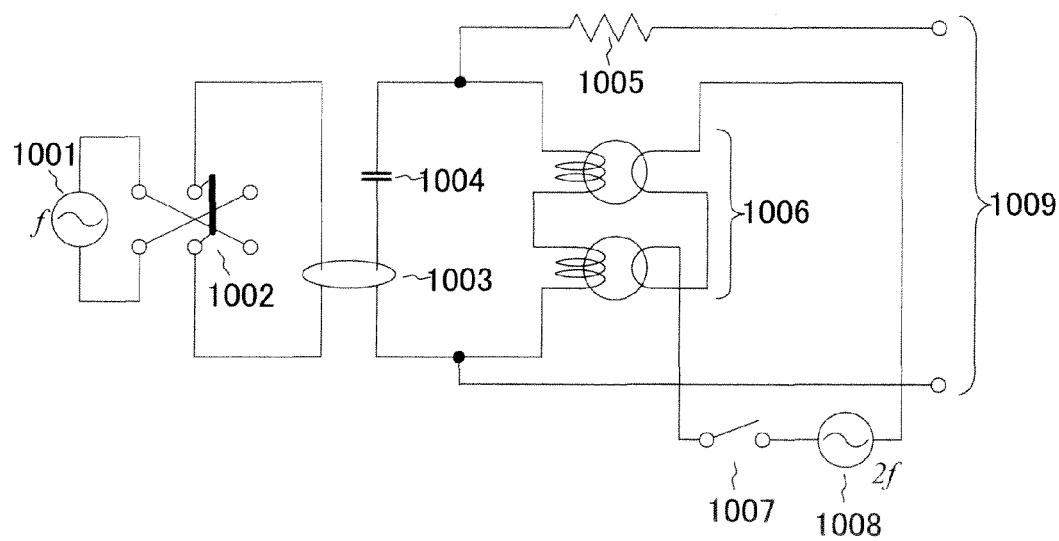
FIG. 10 is a circuit diagram showing the arrangement of the basic elements of a parametron.

A case in which capacitive coupling is used for the excitation means will be explained as the second embodiment of the present invention with reference to FIG. 9. A logical element in the second embodiment includes a beam 907 which is supported by supporting portions 905 and 906 at two ends and has the resonance frequency $f_{res}$. An oscillation detecting electrode (third electrode) 910 is arranged on the supporting portion 906 to detect the oscillation of the beam 907. A common electrode 909 is arranged on the supporting portion 905. Needless to say, the beam 907 is spaced apart from a substrate (not shown). An excitation portion 911 is arranged near the beam 907 on one side in a direction perpendicular to the direction in which the beam 907 extends. A parametric excitation portion 912 is arranged near the beam 907 on the other side in the direction perpendicular to the direction in which the beam 907 extends. The excitation portion 911 and parametric excitation portion 912 comprise an initial excitation electrode 913 and excitation electrode 914, respectively. In this example, the excitation portion 911 and parametric excitation portion 912 are arranged to face each other in the direction perpendicular to the direction in which the beam 907 extends.

Similar to FIG. 3, this circuit includes an input AC signal source 301 which generates an input AC signal having the frequency $f_{res}$, a phase inversion switch 302, a coupling resistor 304, an excitation switch 305, an excitation AC signal source 306 which generates an excitation AC signal having the frequency $2f_{res}$, and an output terminal 307. In addition, this circuit can apply DC power to the beam 907 via a resistor 308. A change of the resistance value of the beam 907 can be detected by the common electrode 909 and oscillation detecting electrode 910, and output from the output terminal 307.

In this circuit, the excitation switch 305 is turned on to apply an excitation AC signal having the frequency $2f_{res}$ from the excitation AC signal source 306 to the excitation electrode 914. The parametric excitation portion 912 applies an electrostatic force to the beam 907, periodically distorting the beam 907. As a result, the beam 907 can be parametrically excited at the frequency $f_{res}$. As described above, either of the two oscillation states different in phase by π can be selected based on the phase of an AC signal input from the input AC signal source 301 to the initial excitation electrode 913 before the start of parametric excitation by turning on the excitation switch 305. The excitation state is detected as a change of the resistance value of the beam 907 by the common electrode 909 and oscillation detecting electrode 910, and output from the output terminal 307.

The logical element having this structure may be fabricated, for example, as follows. First, a silicon oxide layer is formed on a high-resistance single-crystal silicon substrate. A low-resistance silicon layer is formed on the silicon oxide layer by heavily doping an impurity, thereby forming a multilayered structure of the insulating layer (silicon oxide layer)/conductive layer. This multilayered structure is processed by a well-known photolithography technique and etching technique, forming supporting portions 905 and 906, a beam 907, an excitation portion 911, and a parametric excitation portion 912. For example, after the multilayered structure is patterned into the shapes of these portions, the lower insulating layer is selectively etched away by a predetermined amount. As a consequence, the insulating layer is removed from the portion of the beam 907 formed narrower than the remaining portions, spacing the beam 907 apart from the substrate (not shown).

In the logical element fabricated in this way, the supporting portions 905 and 906, excitation portion 911, and parametric excitation portion 912 provide a multilayered structure in which the conductive layer is formed on the insulating layer. The beam 907 has a single-layered structure formed from only the conductive layer. Respective electrodes suffice to be formed from Al electrodes in ohmic contact with the conductive layer of the supporting portions 905 and 906, excitation portion 911, and parametric excitation portion 912. In this example, the beam 907 need not be formed from a piezoelectric material.

In the logical element explained with reference to FIG. 9, the beam 907 (oscillation portion) is made of a semiconductor, and the oscillation state of the oscillation portion can be detected using the deformation potential of the semiconductor. As the semiconductor changes band gap energy upon distortion, the oscillation state can be detected by detecting the change. This state can be detected as a change of the resistance value, as described above. This structure can employ an elemental semiconductor such as silicon or germanium. The oscillation of the oscillation portion may be detected by detecting a tunneling current flowing through the path of the oscillation portion and electrode arranged close to each other. The oscillation may also be detected using the piezoresistance of the oscillation portion.

The logical element in the second embodiment can also configure a shift register or logical circuit. More specifically, similar to the logical element in the first embodiment described above, a plurality of sets each including the beam 907, excitation portion 911, and parametric excitation portion 912 are arrayed at predetermined intervals. Further, an oscillation coupling means such as a transfer electrode or coupling beam is used to couple the oscillations of the adjacent beams 907.

As described above, according to the present invention, problems arising in devices using today's popular transistors as basic elements and conventional parametron elements are solved by adopting a resonator which utilizes mechanical oscillation of an elastic member, instead of an LC resonator in the parametron. In other words, the present invention manipulates bit information by parametrically exciting a mechanical resonator fabricated by microprocessing without using an electrical resonator made up of an inductance and capacitor.

It is generally known that a mechanical resonator minimizes energy dissipation as compared to an electrical resonator. According to the present invention, storage and an arithmetic operation can be done with very small power consumption. In addition, a mechanical resonator is free from capacitive coupling which exists in an electrical resonator, so crosstalk between elements is very small even upon promoting size reduction.

An elastic structure (oscillation portion) for forming a mechanical resonator can be fabricated by a microprocessing technique which has been developed based on so-called semiconductor processes. The elastic structure can be miniaturized to be equal to a logical element using a semiconductor transistor as a basic element.

As a material for fabricating an oscillation portion which builds a resonator, the present invention can employ a multilayered structure of semiconductors having different compositions, a multilayered structure of a semiconductor and insulator, particularly a semiconductor thin-film multilayered structure fabricated by heteroepitaxial growth, or a multilayered structure of a semiconductor and buried oxide film (buried insulating layer). The oscillation portion can also be formed from a carbon nanotube, nanowire, or the like.

To increase the degree of integration by miniaturizing the oscillation portion in the present invention, it is important to apply the microprocessing technique. An oscillation portion which has a portion spaced part from a neighboring structure such as a substrate and can oscillate can be formed easily using an SOI (Silicon On Insulator) substrate recently used in the fabrication of a MEMS (Micro Electro Mechanical System) or NEMS (Nano Electro Mechanical System), and a multilayered structure of semiconductors which are fabricated by molecular beam epitaxy or the like and have different compositions, in addition to a technique (e.g., selective etching) of selectively removing a target thin film. Accordingly, a small mechanical parametron element with high reproducibility and reliability can be fabricated. For example, a logical element (mechanical parametron element) described with reference to FIG. 9 can be fabricated using, for example, an SOI substrate.

With the SOI substrate, a space can be created below the SOI layer by selectively removing a buried insulating layer from the SOI layer. The oscillation portion can be formed easily by processing the SOI layer. When semiconductors having different compositions are stacked on the SOI layer, the oscillation portion can be easily formed from the multilayered structure of the semiconductors having different compositions.

INDUSTRIAL APPLICABILITY

The present invention is preferably applied to an element which forms a storage device or arithmetic device.

The invention claimed is:

1. A logical element comprising
an oscillation portion which mechanically oscillates;
excitation means for parametrically oscillating said oscillation portion in either of a first oscillation state and second oscillation state different in phase by π;
an input portion which receives a signal for parametric oscillation input into said excitation means; and
an output portion which outputs a signal corresponding to either of the first oscillation state and second oscillation state of said oscillation portion that parametrically oscillates, wherein binary information of "0" or "1" is expressed using the first oscillation state or second oscillation state,
wherein said oscillation portion includes a beam having a piezoelectric layer formed from a piezoelectric material, said excitation means is the piezoelectric layer, said input portion is an input electrode which receives an AC voltage for parametrically oscillating the beam, and said output portion is an output electrode for outputting a signal based on a piezoelectric effect of the piezoelectric material.

2. A logical element according to claim 1, wherein the input electrode includes a first electrode which selectively receives first and second AC voltages that have a resonance frequency of the beam and are different in phase by π, and a second electrode which receives a third AC voltage having a frequency double the resonance frequency of the beam to parametrically excite the beam.

3. A logical element according to claim 2, further comprising:
a plurality of beams arrayed at predetermined intervals;
second electrodes arranged for the respective beams;
a first electrode arranged for a beam at one end of the array of the beams;
an output electrode arranged for a beam at the other end of the array of the beams; and
oscillation coupling means for coupling oscillations of adjacent beams.

4. A logical element according to claim 3, wherein said oscillation coupling means is a transfer electrode arranged across adjacent beams.

5. A logical element according to claim 3, wherein said oscillation coupling means is a coupling beam which partially connects adjacent beams.

6. A logical element according to claim 1, wherein the beam includes a conductive layer formed from a first semiconductor, and a piezoelectric layer which is stacked on the conductive layer and formed from either of a second semiconductor lower in conductivity than the first semiconductor, and an insulator.

7. A logical element according to claim 6, wherein the beam includes a conductive layer formed from a first compound semiconductor, and a piezoelectric layer which is stacked on the conductive layer and formed from a second compound semiconductor larger in band gap than the first compound semiconductor.

8. A logical element according to claim 6, wherein the second semiconductor is prepared by heteroepitaxial growth.

9. A logical element comprising:
an oscillation portion which mechanically oscillates;
excitation means for parametrically oscillating said oscillation portion in either of a first oscillation state and second oscillation state different in phase by π;
an input portion which receives a signal for parametric oscillation input into said excitation means; and
an output portion which outputs a signal corresponding to either of the first oscillation state and second oscillation state of said oscillation portion that parametrically oscillates, wherein binary information of "0" or "1" is expressed using the first oscillation state or second oscillation state,
wherein said excitation means includes first excitation means for exciting oscillation of said oscillation portion in either of the first oscillation state and second oscillation state different in phase by π by applying an electrostatic force to said oscillation portion, and second excitation means for parametrically exciting said oscillation portion oscillating in either of the first oscillation state and second oscillation state, and said output portion includes an output electrode which is connected to one end of said oscillation portion and outputs a signal corresponding to oscillation of said oscillation portion.

10. A logical element according to claim 9, wherein said input portion includes a first electrode which selectively receives first and second AC voltages that have a resonance frequency of said oscillation portion and are different in phase by π, and a second electrode which receives a third AC voltage having a frequency double the resonance frequency of said oscillation portion to parametrically excite said oscillation portion.

11. A logical element according to claim 10, further comprising:
a plurality of oscillation portions arrayed at predetermined intervals;
second electrodes arranged for said respective oscillation portions;
a first electrode arranged for an oscillation portion at one end of the array of said oscillation portions;

an output electrode arranged for an oscillation portion at the other end of the array of said oscillation portions; and oscillation coupling means for coupling oscillations of adjacent oscillation portions.

12. A logical element according to claim 11, wherein said oscillation coupling means is a transfer electrode arranged across adjacent beams.

13. A logical element according to claim 11, wherein said oscillation coupling means is a coupling beam which partially connects adjacent beams.

14. A logical element according to claim 9, wherein said oscillation portion is formed from a semiconductor layer formed on a buried insulating layer.

* * * * *